US010355729B2

(12) United States Patent
Fernando

(10) Patent No.: US 10,355,729 B2
(45) Date of Patent: Jul. 16, 2019

(54) SINGLE RECEIVER INTRA-BAND NON-CONTIGUOUS CARRIER AGGREGATION

(71) Applicant: QUALCOMM Incorporated, San Diego, CA (US)

(72) Inventor: Udara Fernando, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 15/703,798

(22) Filed: Sep. 13, 2017

(65) Prior Publication Data

US 2018/0358992 A1    Dec. 13, 2018

Related U.S. Application Data

(60) Provisional application No. 62/517,756, filed on Jun. 9, 2017.

(51) Int. Cl.
*H04B 1/10*    (2006.01)
*H04B 1/00*    (2006.01)
(Continued)

(52) U.S. Cl.
CPC ......... *H04B 1/1036* (2013.01); *H04B 1/0057* (2013.01); *H04B 1/06* (2013.01);
(Continued)

(58) Field of Classification Search
CPC combination set(s) only.
See application file for complete search history.

(56) References Cited

U.S. PATENT DOCUMENTS

| 7,181,184 B1* | 2/2007 | Dimeo | H04B 1/1036 375/346 |
| 8,457,574 B2* | 6/2013 | Gomez | H03J 5/12 348/731 |

(Continued)

FOREIGN PATENT DOCUMENTS

| WO | WO-2016174302 A1 | 11/2016 |
| WO | WO-2016175974 A1 | 11/2016 |

OTHER PUBLICATIONS

Chen R., et al., "Reconfigurable Receiver with Radio-Frequency Current-Mode Complex Signal Processing Supporting Carrier Aggregation", IEEE Journal of Solid-State Circuits, vol. 50, No. 12, Dec. 2015, pp. 3032-3046.

(Continued)

*Primary Examiner* — Junpeng Chen
(74) *Attorney, Agent, or Firm* — Qualcomm Incorporated/Seyfarth Shaw LLP; Alan M. Lenkin

(57) ABSTRACT

A single receiver to process multiple signals to achieve carrier aggregation includes a main path, an auxiliary path and one or more local oscillators. The main path has an input that receives an input signal. The input signal includes non-contiguous wanted signals and a jammer signal. The single receiver also includes an output coupled to a modem. The output provides the wanted signals to the modem. The auxiliary path is coupled to ground and includes an N-path filter. The N-path filter has multiple mixers. The N-path filter filters out at least a portion of the jammer signal in one or more gaps between the non-contiguous wanted signals in a same frequency band. The one or more local oscillators are coupled to the main path and/or the auxiliary path to provide a first reference signal to the main path and/or to the N-path filter of the auxiliary path.

21 Claims, 10 Drawing Sheets

(51) Int. Cl.
*H04B 1/06* (2006.01)
*H03H 19/00* (2006.01)

(52) U.S. Cl.
CPC ............. *H04B 1/10* (2013.01); *H03H 19/002* (2013.01); *H04B 2001/1063* (2013.01)

(56) References Cited

U.S. PATENT DOCUMENTS

| | | |
|---|---|---|
| 9,130,532 B2 | 9/2015 | Hasan et al. |
| 9,413,400 B1 * | 8/2016 | Hedayati .............. H04B 1/1027 |
| 2015/0180523 A1 | 6/2015 | Tasic et al. |
| 2015/0236798 A1 | 8/2015 | Nobbe |
| 2015/0381112 A1 | 12/2015 | Wang et al. |
| 2016/0126990 A1 | 5/2016 | Leipold et al. |
| 2017/0214391 A1 * | 7/2017 | Hedayati .............. H03H 19/002 |
| 2017/0244375 A1 * | 8/2017 | Oshima ................. H03H 19/00 |

OTHER PUBLICATIONS

Ghaffari A., et al., "8-Path Tunable RF Notch Filters for Blocker Suppression", IEEE International Solid-State Circuits Conference, ISSCC, Session 4, RF Techniques 4.2, Feb. 20, 2012, pp. 76-78.
International Search Report and Written Opinion—PCT/US2018/031188—ISA/EPO—dated Jul. 12, 2018.
Darvishi, Milad et al., "Design of Active N-Path Filters," IEEE Journal of Solid-State Circuits, vol. 48, No. 12, Dec. 2013—pp. 2962-2976.

* cited by examiner

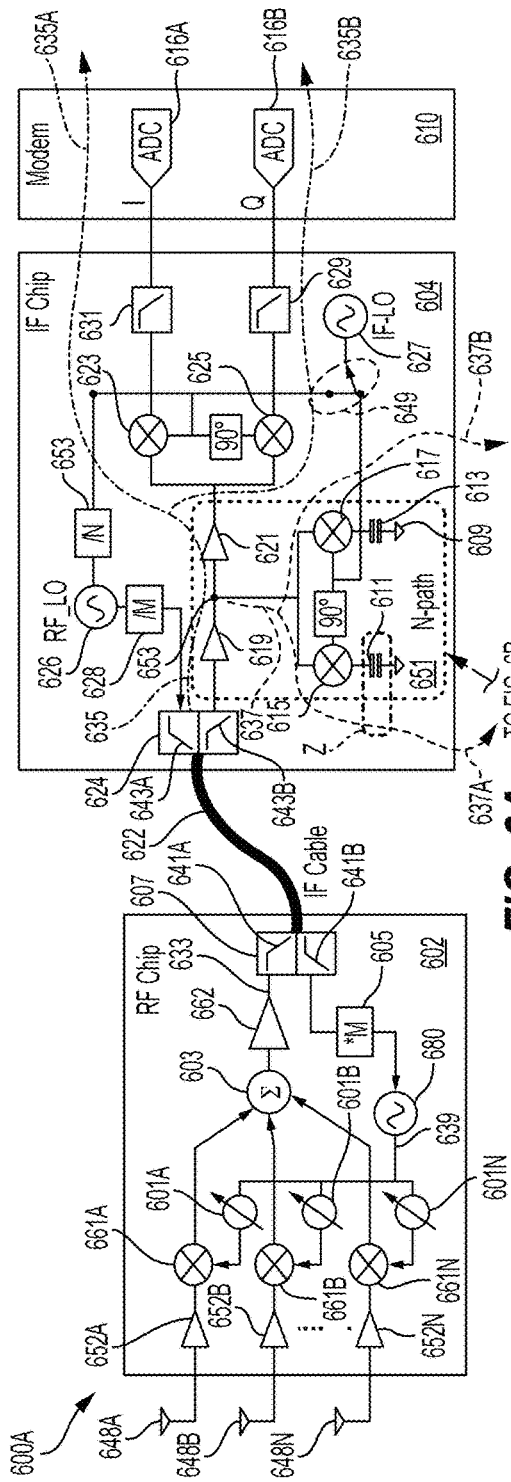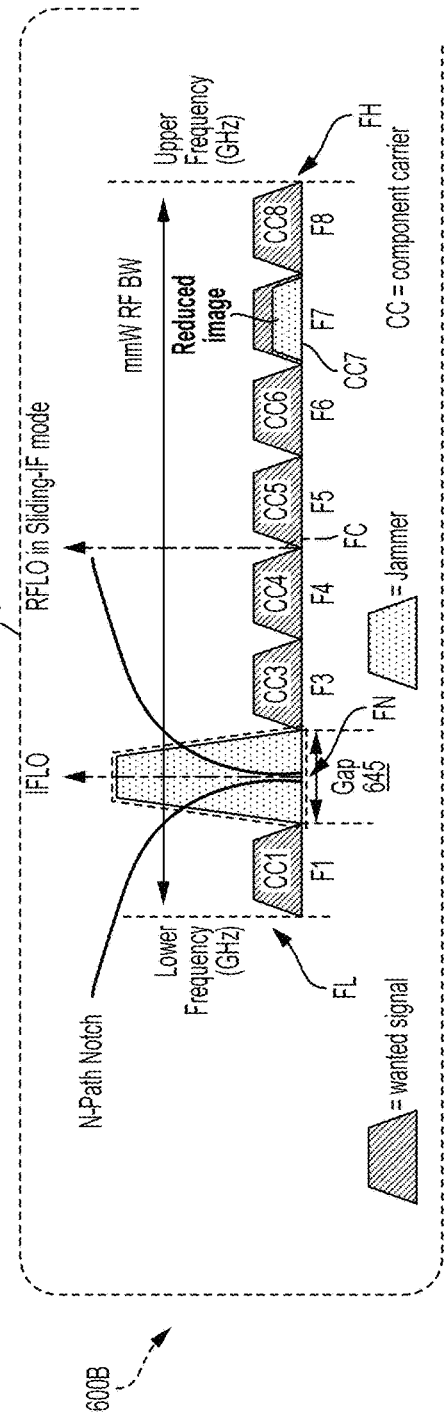
FIG. 6A
FIG. 6B

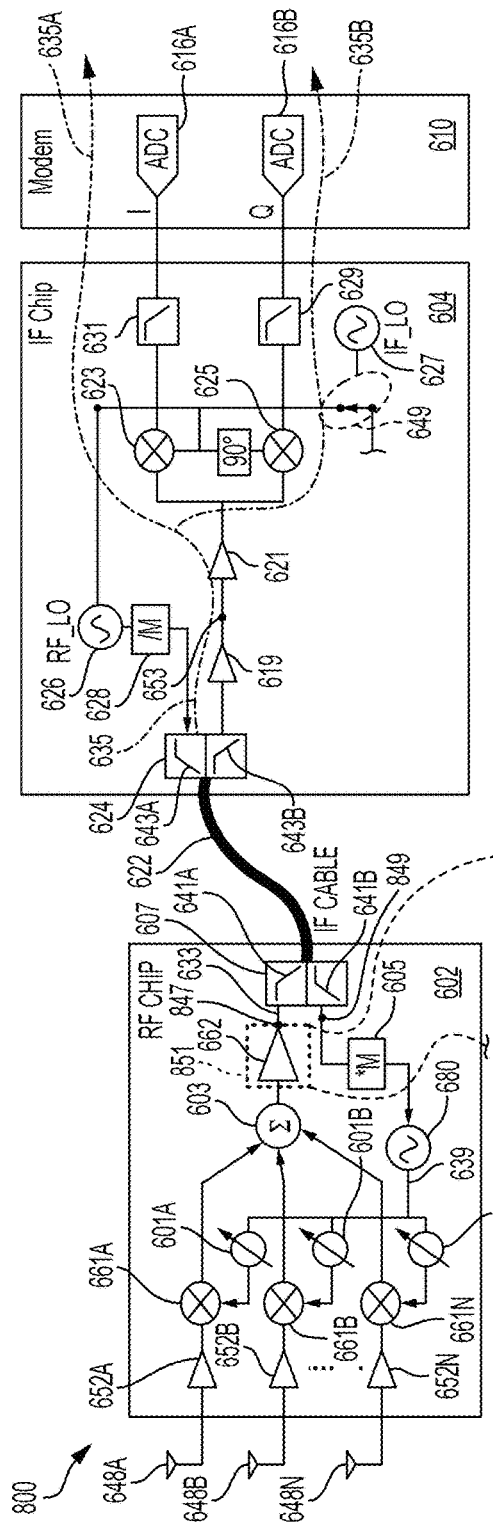
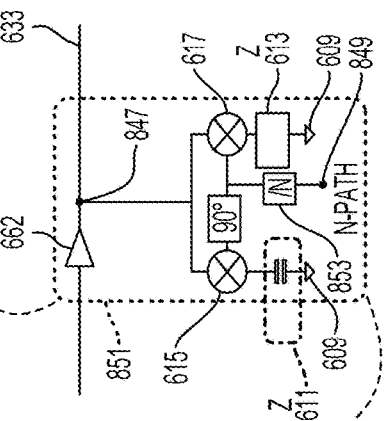
FIG. 8A
FIG. 8B

SINGLE RECEIVER INTRA-BAND NON-CONTIGUOUS CARRIER AGGREGATION

CROSS-REFERENCE TO RELATED APPLICATION

The present application claims the benefit of U.S. Provisional Patent Application No. 62/517,756, filed on Jun. 9, 2017, and titled "SINGLE RECEIVER INTRA-BAND NON-CONTIGUOUS CARRIER AGGREGATION," the disclosure of which is expressly incorporated by reference herein in its entirety.

TECHNICAL FIELD

The present disclosure generally relates to wireless receivers. More specifically, the present disclosure relates to sliding intermediate frequency (IF) based intra-band non-contiguous carrier aggregation (CA) in a single receiver.

BACKGROUND

Advances in technology have resulted in smaller and more powerful computing devices. For example, there currently exist a variety of portable personal computing devices, including wireless computing devices, such as portable wireless telephones, user equipments (UEs), personal digital assistants (PDAs), and paging devices that are small, lightweight, and easily carried by users. More specifically, portable wireless telephones, such as cellular telephones and Internet protocol (IP) telephones, can communicate voice and data packets over wireless networks.

In some types of wireless networks, the UE communicates with one or more network base stations. In some scenarios, different base stations may use different radio access technologies (RATs). The term RAT refers to the physical connection for a radio-based communication network. Examples of different RATs include, without limitation, third generation partnership project (3GPP) technologies (e.g., third generation technology (3G), fourth generation technology (4G), and fifth generation technology (5G)), millimeter wave (mmW) technology (extremely high frequency (EHF)), Bluetooth technology, and Wi-Fi technology. In a millimeter wave (mmW) system, multiple antennas are used for beamforming (e.g., in the range of 30 gigahertz (GHz), 60 GHz, etc.)

The different RATs may have different capabilities. For example, the UE may have the capability to access both a long term evolution (LTE) network and a millimeter wavelength (mmW) network. The downlink/uplink (DL/UL) access link between an LTE base station and the UE is generally more reliable than the access link between an mmW base station and the UE. However, the LTE link generally has lower capacity than the mmW link.

In UEs that can simultaneously transmit and receive wireless communications in accordance with the wireless network, transmit (Tx) leakage can impose a performance limitation on receive (Rx) circuitry. Tx leakage and other jammers in the Rx circuitry can be modulated and down-converted to baseband along with a received wireless signal. Tx leakage and jammers may have a relatively large voltage swing compared to the received signal and may saturate an output of a receiver that converts the received signal from radio frequency (RF) to baseband.

In carrier aggregation (CA) architectures, blockers (Tx leakage and jammers) are a performance limitation of Rx circuitry. For intra-CA operation where a low noise amplifier (LNA) is followed by a cascode device or a transconductance stage, the LNA output is a high impedance node. The high impedance causes large blocker swing and linearity issues. For concurrent CA operation, the noise figure in one CA receive path may be degraded if a signal in another CA receive path is larger and acts as a jammer.

SUMMARY

A single receiver to process multiple signals may include a main path comprising an input that receives an input signal. The input signal includes non-contiguous wanted signals and a jammer signal. The single receiver also includes an output coupled to a modem. The output provides the wanted signals to the modem. The single receiver also includes an auxiliary path to ground that includes an N-path filter. The N-path filter includes multiple mixers. The N-path filter filters out at least a portion of the jammer signal in one or more gaps between the non-contiguous wanted signals in a same frequency band. The single receiver further includes one or more local oscillators coupled to the main path and/or the auxiliary path to provide a first reference signal to the main path and/or to the N-path filter of the auxiliary path.

A method for filtering jammer signals in a single receiver may include receiving a radio frequency signal including non-contiguous wanted signals and a jammer signal at a main path of the single receiver. The single receiver includes one or more local oscillators to provide a reference frequency to the main path and/or to an auxiliary path coupled to the main path. The method also includes selectively coupling an N-path filter in the auxiliary path to the one or more local oscillators. The method further includes filtering out, by the N-path filter, at least a portion of the jammer signal in one or more gaps between the non-contiguous wanted signals in a same frequency band.

A single receiver to process multiple signals may include a main path comprising an input that receives an input signal. The input signal includes non-contiguous wanted signals and a jammer signal. The single receiver also includes an output coupled to a modem. The output provides the wanted signals to the modem. The single receiver also includes an auxiliary path to ground that includes an N-path filter. The N-path filter includes multiple mixers. The N-path filter filters out at least a portion of the jammer signal in one or more gaps between the non-contiguous wanted signals in a same frequency band. The single receiver further includes means for providing a first reference signal to the main path and/or to the N-path filter of the auxiliary path.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIG. 6A is a block diagram that depicts a single receiver of a wireless device that is operable to adjust a frequency of a signal communicated between a radio frequency (RF) device and an intermediate frequency (IF) device according to aspects of the present disclosure.

FIG. 6B is an exemplary graph illustrating impedance characteristics of a notch flier in an auxiliary path of the single receiver of FIG. 6A.

FIG. 8A is a block diagram that depicts a single receiver of a wireless device that is operable to adjust a frequency of a signal communicated between a radio frequency (RF) device and an intermediate frequency (If) device according to a filtering mode where the filter is included in an auxiliary path of the RF device.

FIG. 8B is an extrapolation of a region including the auxiliary path of the RF device of FIG. 8A.

DETAILED DESCRIPTION

Figure 1:
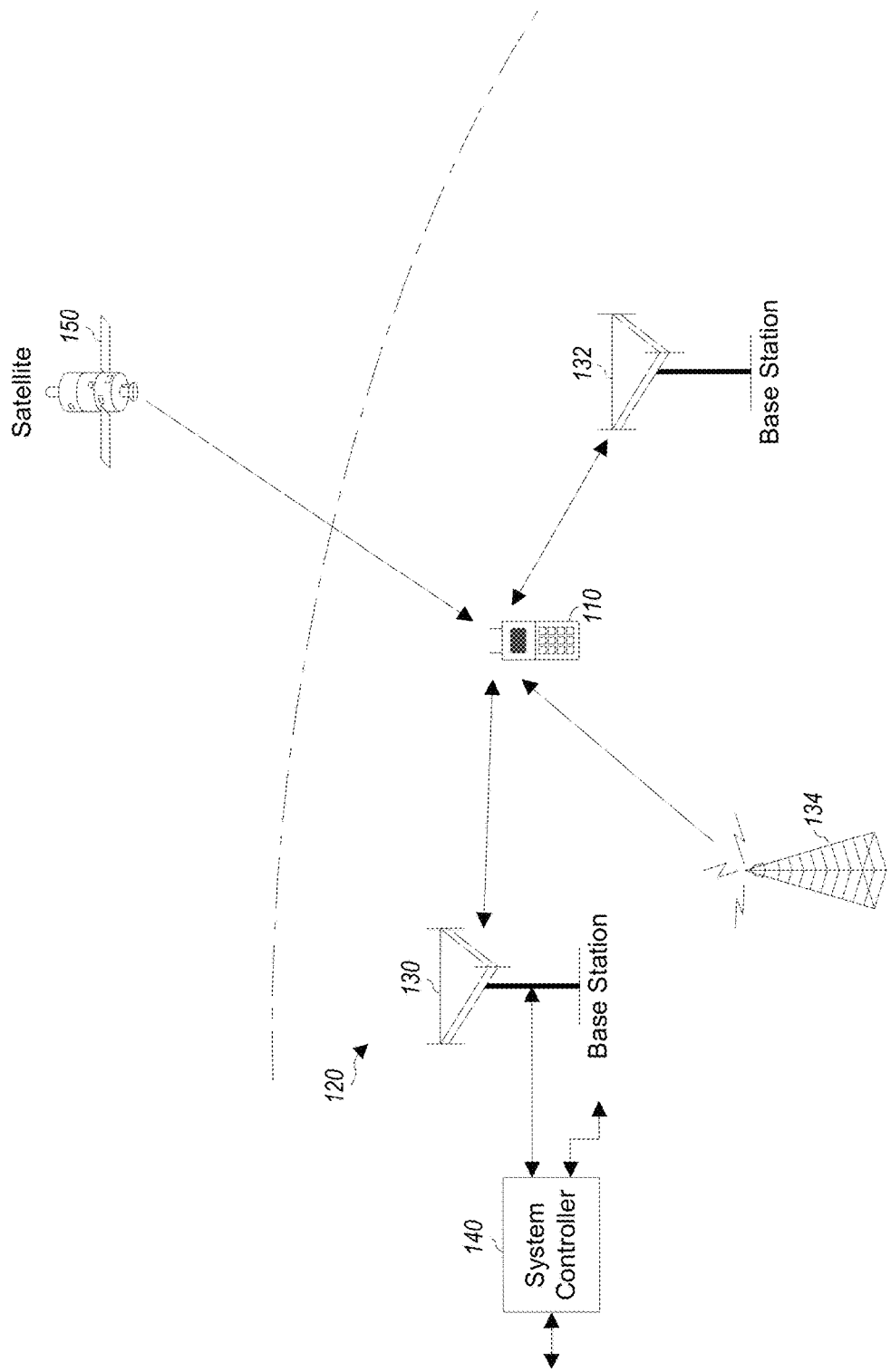
FIG. 1 shows a wireless device communicating with a wireless communication system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

In user equipments (UEs) that can simultaneously transmit and receive wireless signals in accordance with the wireless network, transmit (Tx) leakage can impose a performance limitation on receive (Rx) circuitry. Tx leakage and other jammers (or jammer signals) in the Rx circuitry can be modulated and down-converted to baseband along with a received wireless signal. Tx leakage and jammers may have a relatively large voltage swing compared to the received signal and may saturate an output of a receiver that converts the received signal from radio frequency (RF) to baseband.

In carrier aggregation (CA) architectures, blockers (Tx leakage and jammers) are a performance limitation of Rx circuitry. For intra-band CA operation where a low noise amplifier (LNA) is followed by a cascode device or a transconductance stage, the LNA output is a high impedance node. The high impedance causes large blocker swing and linearity issues. For concurrent CA operation, the noise figure in one CA receive path may be degraded if a signal in another CA receive path is larger and acts as a jammer.

Techniques for reducing the effect of the jammer include using multiple receivers. For example, intra-band non-contiguous carrier aggregation specifies dual receivers to filter jammers in a carrier aggregation gap. The two receivers, however, use more power relative to a single receiver. Accordingly, it is desirable to provide a single receiver approach to filter out the jammers.

Aspects of the present disclosure are directed to carrier aggregation in a single receiver. For example, the disclosure is directed to sliding intermediate frequency (sliding-IF) based intra-band non-contiguous carrier aggregation in a single receiver (e.g., sliding-IF configuration). Alternatively, the disclosure is applicable to non-IF based intra-band non-contiguous carrier aggregation in a single receiver (e.g., non-sliding-IF configuration). The single receiver may receive a wireless signal based on voice or data.

When the implementation is in accordance with the sliding-IF configuration, a down-converter may use a front end scheme to select a destination signal and another scheme (e.g., a heterodyne scheme) to convert a received radio frequency (RF) signal to an intermediate frequency (IF) signal, instead of directly converting the RF signal to a baseband (BB) signal. This implementation may be applicable to a mmW system where multiple antennas (e.g., phased array antennas) are used for beamforming (e.g., in the range of 30 GHz, 60 GHz, etc.) To process mmW signals, some wireless devices (e.g., mobile phone) include RF chips integrated with antennas in one or more corners of the wireless device. Because it is undesirable to include modems and analog-to-digital converters (ADCs) at the corners of the mobile phone, it is difficult for the RF device positioned at the corners of the phone to convert the received RF signal to baseband. Thus, wireless devices are designed with IF devices for processing signals under these conditions. For example, the RF device converts the RF signal (e.g., 28 GHz-30 GHz) to an IF signal (<10 GHz), and provides the IF signal to the IF device, which converts the IF signal to the baseband signal. The IF device may be positioned away from the corners of the mobile phone and proximate the modem and the ADCs. For example, a cable (e.g., IF cable) is used to connect the RF device to the IF device.

In one aspect of the disclosure, the single receiver includes an IF device that has multiple (e.g., two) local oscillators (LOs) and a filter. The filter may be adjustable (during operation) by, for example, adjusting the passive devices that make up the filter. Multiple LOs can be used to place the center frequency of the filter at any desired frequency determined by the LO frequency. The single receiver further includes an RF circuit (or device) between one or more antennas and the intermediate frequency device. For example, the RF device may be integrated with one or more antennas of the multiple antennas of a mmW system to achieve beamforming. For example, a front-end of the receiver includes multiple receive paths (e.g., N paths) corresponding to multiple carriers (e.g., N carriers). The multiple receive paths may be combined (using a summer or combiner) into a main path to propagate the received signal through the RF device and the IF device of the single receiver.

The filter of the IF device may be an N-path filter selectively coupled to one or more of the multiple local oscillators to filter out the jammer signal in one or more gaps between the non-contiguous frequency bands. The N-path filter is placed in a shunt configuration (or parallel configuration with respect to a main path of the receiver) between separate up/down converter circuit blocks. For example, the main path for processing the received RF signal is connected to an auxiliary path to ground that includes the N-path filters to notch the jammers. In one aspect of the disclosure, the N-path filter may be included in the RF device. In another aspect, the N-path filter may be included in the IF device. Alternatively, the N-path filter may be included in both the IF device and the RF device.

The IF device converts the IF signal received from the RF device to the baseband signal. The IF device may be closer to the modem than the RF device. In some implementations, the IF device may be part of the modem.

When the implementation is in accordance with the non-sliding-IF configuration, the radio frequency signal is not converted to an IF signal. Accordingly, there is no need for an IF device because the RF device directly converts the received RF signal to the baseband signal. In this aspect, the N-path filter is in the RF device.

In some aspects, the N-path filter may be a complex bandpass filter or a notch filter. When the N-path filter is a notch filter, the N-path filter generates a notch at a frequency of the jammer signal in a gap between two wanted carriers during carrier aggregation communication. The non-contiguous frequency bands may correspond to non-contiguous component carriers in a carrier aggregation system. The N-path filter enables the use of the single receiver to mitigate the effect of the jammer signal. The N-path filter creates a notch at the intermediate frequency (not the baseband frequency) to attenuate the jammer signal to acceptable levels. For example, a receiver chip may include two independent local oscillators that can be configured for multiple operating modes. One of the local oscillators may be selectively coupled to the N-path filter to provide a reference signal to the N-path filter.

The multiple modes include a low power sliding intermediate frequency (IF) mode where a single local oscillator (e.g., a radio frequency local oscillator (RFLO)) is coupled to the N-path filter and the single RFLO (e.g., a first LO) drives multiple mixers (e.g., a mixer in the main path and a mixer in the auxiliary path or a mixer in the RF device and a mixer in the IF device). In some aspects, mixers in the main path are RF mixers and IF mixers that process wanted signals while mixers in the auxiliary path act as filters that ground the unwanted signal. The single LO for the low power sliding-IF mode may be subject to spurs or spurious emissions from a neighboring chip. To avoid the issues with the use of the single LO in the sliding-IF mode, a second LO is introduced. The second LO may be a dedicated LO to provide a reference frequency to the N-path filter, while the other LO is for processing the received RF signal along the main path. This mode is deemed a spur mitigation mode (e.g., for co-existence with 4G LTE/Wi-Fi) where two local oscillators are used.

The multiple modes further include a notch filter mode to attenuate the in-band large jammers where one of the local oscillators (e.g., the second LO) is driving the N-path filter and the other local oscillator (e.g., the first LO) is used for the sliding intermediate frequency mode. The notch filter may be reconfigurable or tunable. For example, in the notch filter mode, the second LO can be programmed to a frequency of the jammer signal. The second LO may be selectively connected to the notch filter to selectively activate the notch filter mode during carrier aggregation communication.

Figure 5:
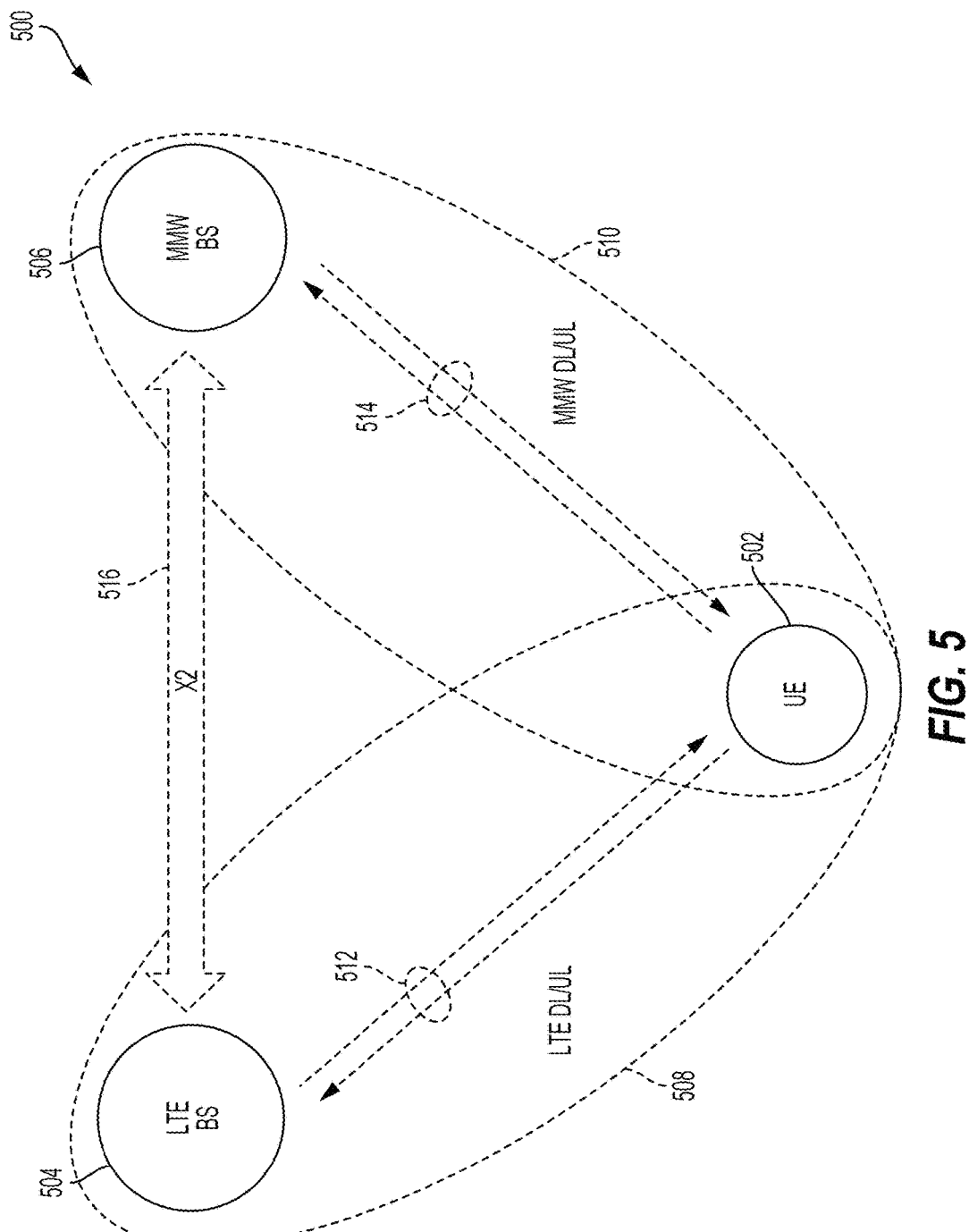
FIG. 5 illustrates an example of a communication system in which aspects of the disclosure may be implemented.
Figure 10:
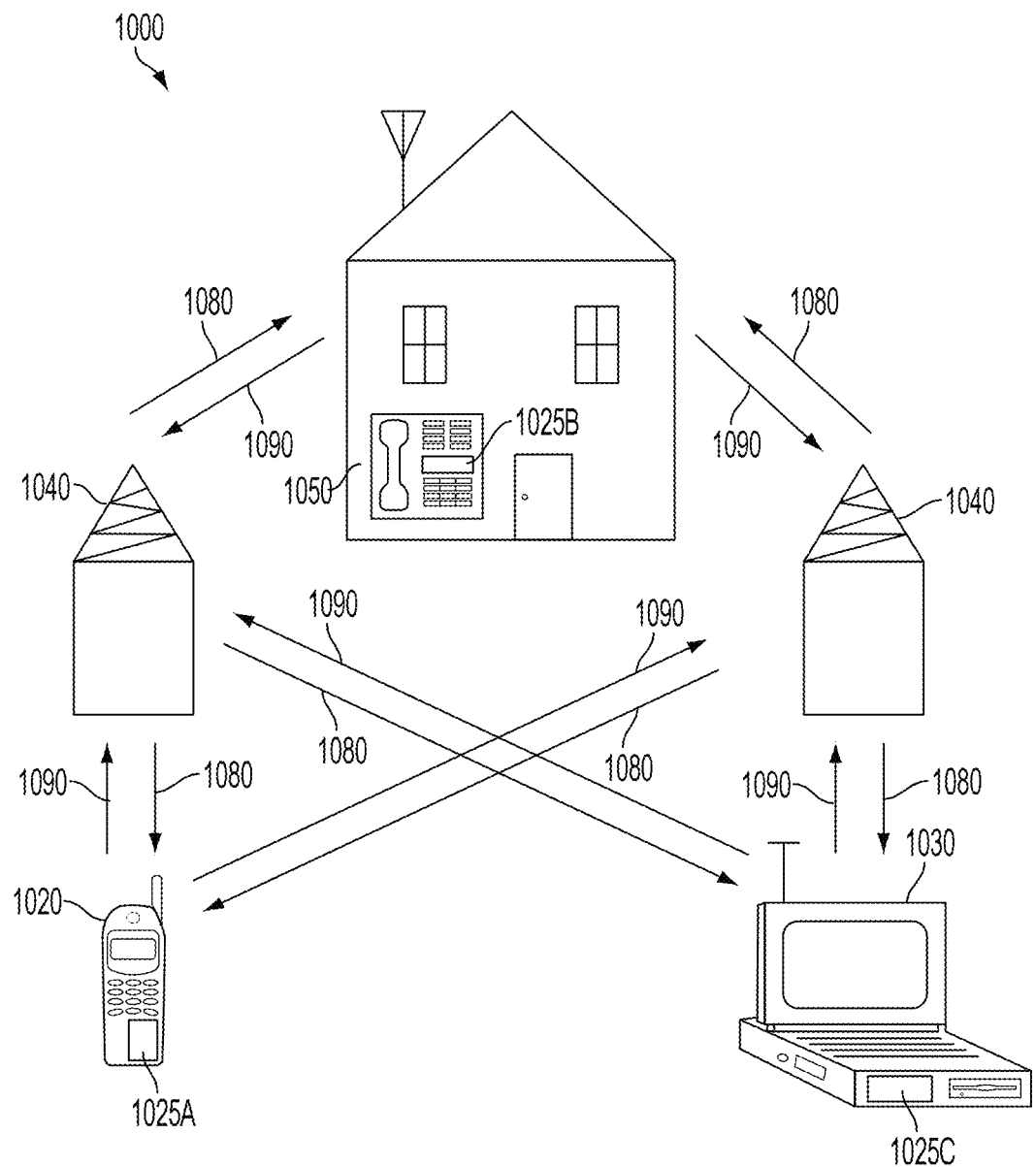
FIG. 10 is a block diagram showing an exemplary wireless communication system in which a configuration of the disclosure may be advantageously employed.

The aspects of the present disclosure may be implemented in the systems of FIGS. 1, 5, and 10. More specifically, aspects of the present disclosure may be implemented in the wireless devices of FIGS. 2 and 3.

FIG. 1 shows a wireless device 110 communicating with a wireless communication system 120. The wireless communication system 120 may be a 5G system, a long term evolution (LTE) system, a code division multiple access (CDMA) system, a global system for mobile communications (GSM) system, a wireless local area network (WLAN) system, or some other wireless system. A CDMA system may implement wideband CDMA (WCDMA), time division synchronous CDMA (TD-SCDMA), CDMA2000, or some other version of CDMA. For simplicity, FIG. 1 shows the wireless communication system 120 including two base stations 130 and 132 and one system controller 140. In general, a wireless system may include any number of base stations and any number of network entities.

A wireless device 110 may be referred to as a user equipment (UE), a mobile station, a terminal, an access terminal, a subscriber unit, a station, etc. The wireless device 110 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as 5G, LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690 MHz, ultra-high band from 3400 to 3800 MHz, and long term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to 5 carriers in one or two bands in LTE Release 11.

Figure 2:
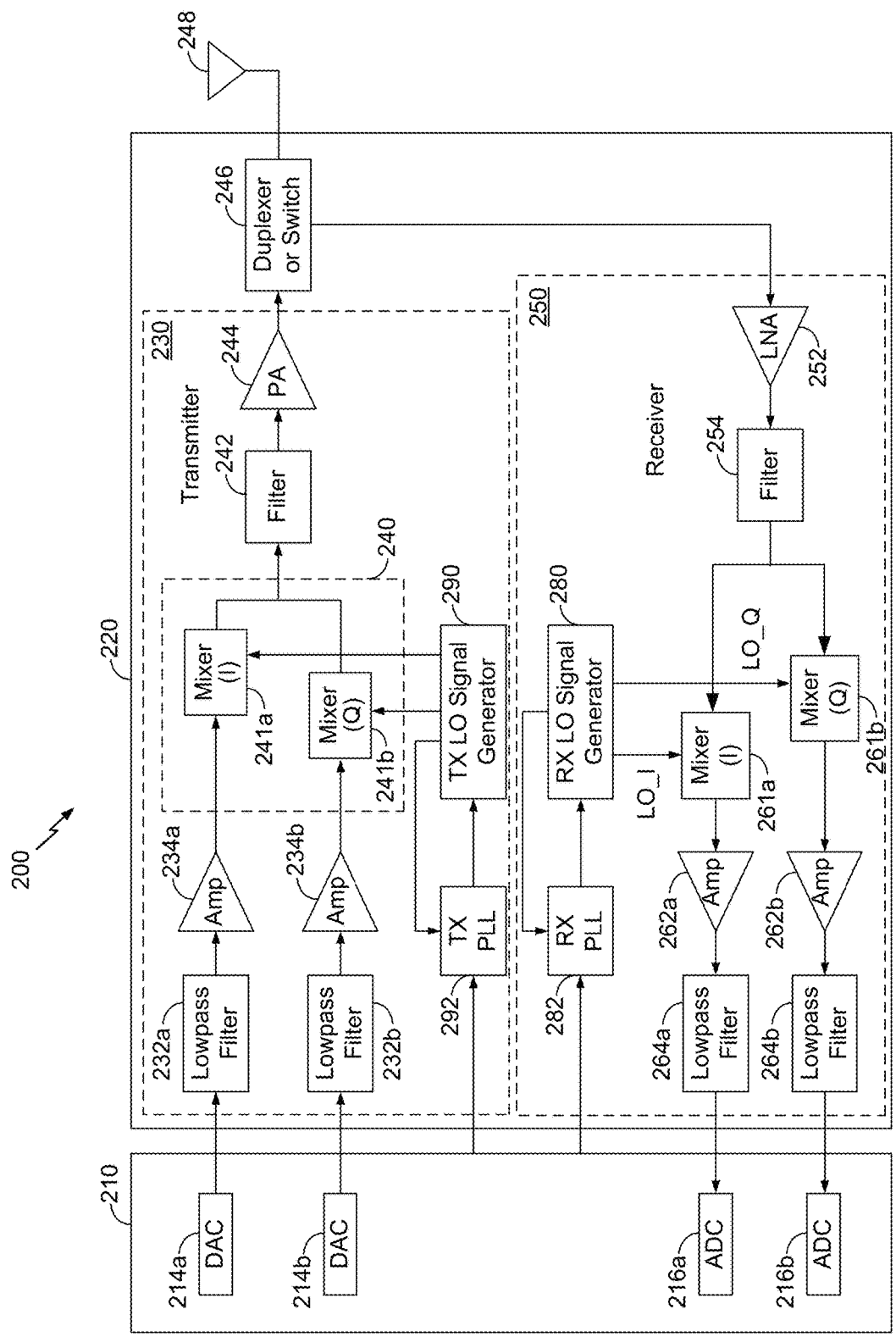
FIG. 2 shows a block diagram of the wireless device in FIG. 1, according to an aspect of the present disclosure.

FIG. 2 shows a block diagram of an exemplary design of a wireless device 200, such as the wireless device 110 shown in FIG. 1. FIG. 2 shows an example of a transceiver 220, which may be a wireless transceiver (WTR). In general, the conditioning of the signals in a transmitter 230 and a receiver 250 may be performed by one or more stages of amplifier(s), filter(s), upconverters, downconverters, and the like. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other illustrations in the drawings, may be either single-ended or differential. Some circuit blocks in FIG. 2 may also be omitted.

In the example shown in FIG. 2, the wireless device 200 generally includes the transceiver 220 and a data processor 210. The data processor 210 may include a memory (not shown) to store data and program codes, and may generally include analog and digital processing elements. The transceiver 220 may include the transmitter 230 and receiver 250 that support bi-directional communication. In general, the wireless device 200 may include any number of transmitters and/or receivers for any number of communication systems and frequency bands. All or a portion of the transceiver 220 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and from intermediate frequency to baseband in another stage for a receiver. In the direct-conversion architecture, a signal is frequency-converted between radio frequency and baseband in one stage. The super-heterodyne and direct-conversion architectures may use different circuit blocks and/or have different requirements. In the example shown in FIG. 2, the transmitter 230 and the receiver 250 are implemented with the direct-conversion architecture.

In a transmit path, the data processor 210 processes data to be transmitted. The data processor 210 also provides in-phase (I) and quadrature (Q) analog output signals to the transmitter 230 in the transmit path. In an exemplary aspect, the data processor 210 includes digital-to-analog converters (DACs) 214a and 214b for converting digital signals generated by the data processor 210 into the in-phase (I) and quadrature (Q) analog output signals (e.g., I and Q output currents) for further processing.

Within the transmitter 230, lowpass filters 232a and 232b filter the in-phase (I) and quadrature (Q) analog transmit signals, respectively, to reduce undesired images caused by the prior digital-to-analog conversion. Amplifiers (Amp) 234a and 234b amplify the signals from lowpass filters 232a and 232b, respectively, and provide in-phase (I) and quadrature (Q) baseband signals. An upconverter 240 including upconversion mixers 241a and 241b upconverts the in-phase (I) and quadrature (Q) baseband signals with in-phase (I) and quadrature (Q) transmit (TX) local oscillator (LO) signals from a TX LO signal generator 290 to provide an upconverted signal. A filter 242 filters the upconverted signal to reduce undesired images caused by the frequency upconversion as well as interference in a receive frequency band. A power amplifier (PA) 244 amplifies the signal from filter 242 to obtain the desired output power level and provides a transmit radio frequency signal. The transmit radio frequency signal is routed through a duplexer/switch 246 and transmitted via an antenna 248.

In a receive path, the antenna 248 receives communication signals and provides a received radio frequency (RF) signal, which is routed through the duplexer/switch 246 and provided to a low noise amplifier (LNA) 252. The duplexer/switch 246 is designed to operate with a specific receive (RX) to transmit (TX) (RX-to-TX) duplexer frequency separation, such that RX signals are isolated from TX signals. The received RF signal is amplified by the LNA 252 and filtered by a filter 254 to obtain a desired RF input signal. Downconversion mixers 261a and 261b mix the output of the filter 254 with in-phase (I) and quadrature (Q) receive (RX) LO signals (i.e., LO_I and LO_Q) from an RX LO signal generator 280 to generate in-phase (I) and quadrature (Q) baseband signals. The in-phase (I) and quadrature (Q) baseband signals are amplified by amplifiers 262a and 262b and further filtered by lowpass filters 264a and 264b to obtain in-phase (I) and quadrature (Q) analog input signals, which are provided to the data processor 210. In the exemplary configuration shown, the data processor 210 includes analog-to-digital converters (ADCs) 216a and 216b for converting the analog input signals into digital signals for further processing by the data processor 210.

In FIG. 2, the transmit local oscillator (TX LO) signal generator 290 generates the in-phase (I) and quadrature (Q) TX LO signals used for frequency upconversion, while a receive local oscillator (RX LO) signal generator 280 generates the in-phase (I) and quadrature (Q) RX LO signals used for frequency downconversion. Each LO signal is a periodic signal with a particular fundamental frequency. A phase locked loop (PLL) 292 receives timing information from the data processor 210 and generates a control signal used to adjust the frequency and/or phase of the TX LO signals from the TX LO signal generator 290. Similarly, a PLL 282 receives timing information from the data processor 210 and generates a control signal used to adjust the frequency and/or phase of the RX LO signals from the RX LO signal generator 280.

The wireless device 200 may support carrier aggregation and may (i) receive multiple downlink signals transmitted by one or more cells on multiple downlink carriers at different frequencies, and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

Figure 3:
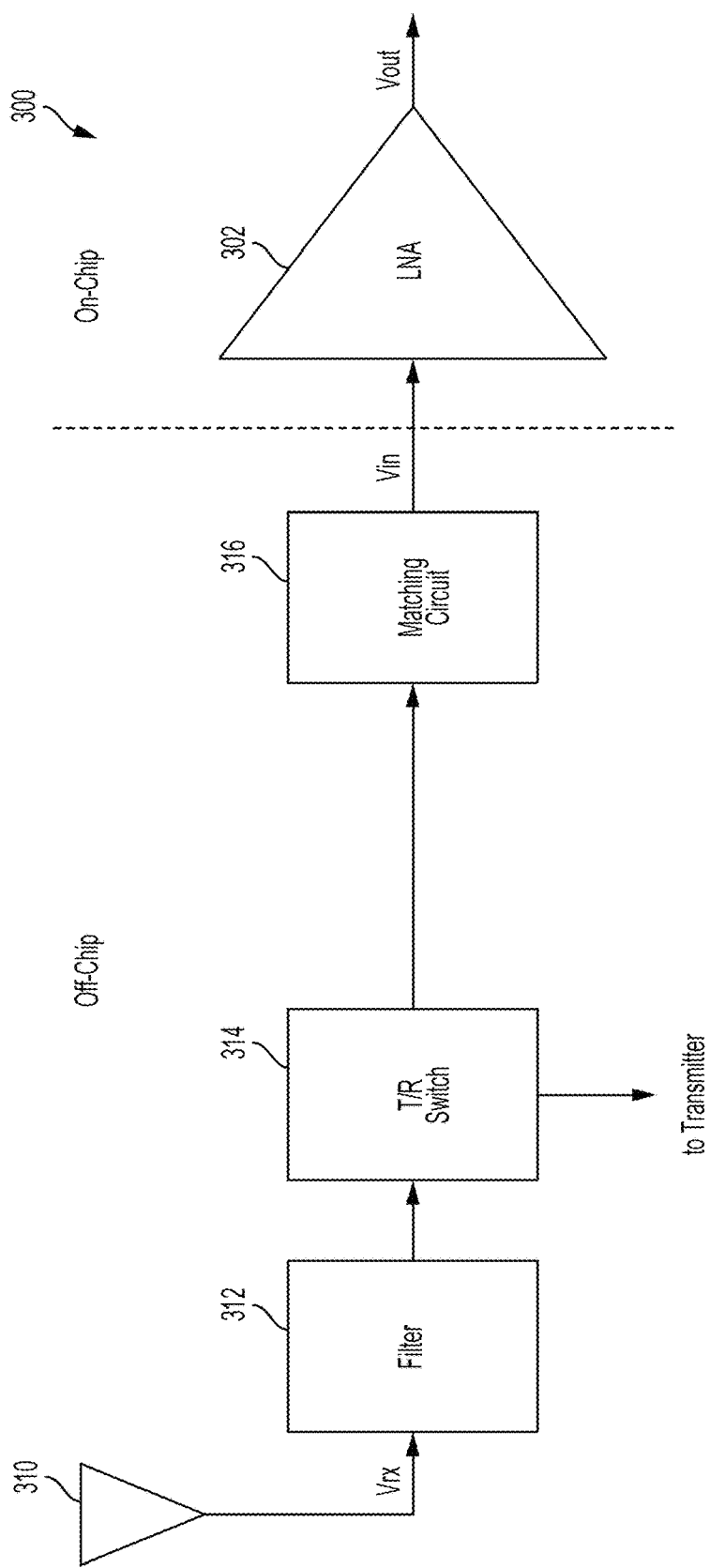
FIG. 3 shows an exemplary design of a front-end of the wireless device.

FIG. 3 shows an exemplary design of a front-end of the wireless device 300. The wireless device 300 may be a user equipment, a cellular phone, or some other device. The wireless device 300 includes a transmitter and a receiver. For simplicity, only a portion of the receiver is shown in FIG. 3, and the transmitter is not shown.

In a receive path, an antenna 310 receives signals transmitted by base stations and/or other transmitter stations and provides a received radio frequency (RF) signal, Vrx. A filter (e.g., bandpass filter) 312 filters the received RF signal to remove out-of-band noise and undesired signals and provides a filtered RF signal. A transmit/receive (T/R) switch 314 connects the receiver or a transmitter to the antenna 310 at any given moment. In a receive mode, the receiver is selected, and the T/R switch 314 routes the filtered RF signal from the filter 312 to a matching circuit 316. In a transmit mode, the transmitter is selected, and the T/R switch 314 receives a transmit RF signal from the transmitter and routes the transmit RF signal to the filter 312 for transmission via the antenna 310.

The matching circuit 316 performs input impedance matching for a low noise amplifier (LNA) 302 and provides an input RF signal Vin to the LNA. The matching circuit 316 may be implemented with inductors, capacitors, etc. The LNA 302 amplifies the input RF signal Vin and provides an output RF signal Vout.

The LNA 302 may be implemented on-chip within an integrated circuit (IC), which may be an analog IC, an RF IC (RFIC), a mixed signal IC, etc. The filter 312, the T/R switch 314, and the matching circuit 316 may be implemented off-chip and external to the IC. Some or all of these circuit blocks (e.g., T/R switch 314 and the matching circuit 316) may be implemented with external discrete components, which may then increase the cost and size of wireless device 300.

The filter 312, the T/R switch 314, and matching circuit 316 may be coupled in cascade, as shown in FIG. 3. These circuit blocks may be implemented with passive circuits. Each of these circuit blocks may then have some insertion loss, which may then degrade the noise figure of the receiver.

The wireless device 300 may support carrier aggregation, which is operation on multiple carriers. Carrier aggregation may also be referred to as multi-carrier operation. According to an aspect of the present disclosure, the wireless device 300 may be able to operate in low-band from 698 to 960 megahertz (MHz), mid-band from 1475 to 2170 MHz, and/or high-band from 2300 to 2690, ultra-high band from 3400 to 3800 MHz, and long term evolution (LTE) in LTE unlicensed bands (LTE-U/LAA) from 5150 MHz to 5950 MHz. The wireless device may also be able to operate in the millimeter wave (mmW) band or spectrum. The mmW band may include extremely high frequency up to and including terahertz frequencies. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. Each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to 5 carriers in one or two bands in LTE Release 11.

In general, carrier aggregation (CA) may be categorized into two types: intra-band CA and inter-band CA. Intra-band CA refers to operation on multiple carriers within the same band and inter-band CA refers to operation on multiple carriers in different bands.

Figure 4A:
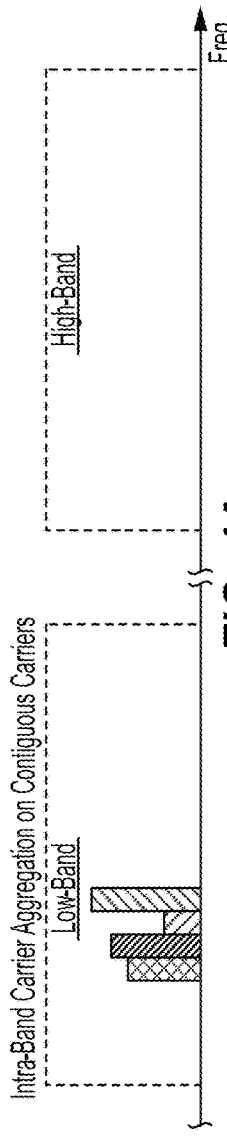
FIGS. 4A-4D show four examples of carrier aggregation (CA).

FIG. 4A shows an example of contiguous intra-band CA. In the example shown in FIG. 4A, a wireless device (e.g., the wireless device 110) is configured with four contiguous carriers in the same band, which is a band in low-band. The wireless device may send and/or receive transmissions on multiple contiguous carriers within the same band.

Figure 4B:
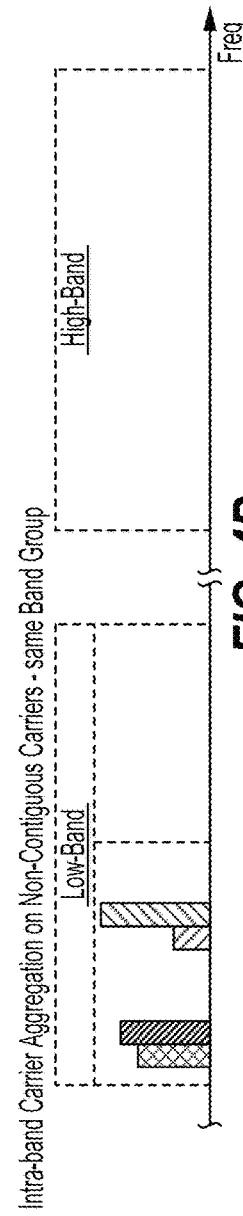

FIG. 4B shows an example of non-contiguous intra-band CA. In the example shown in FIG. 4B, a wireless device (e.g., the wireless device 110) is configured with four non-contiguous carriers in the same band, which is a band in low-band. The carriers may be separated by 5 MHz, 10 MHz, or some other amount. The wireless device may send and/or receive transmissions on multiple non-contiguous carriers within the same band.

Figure 4C:
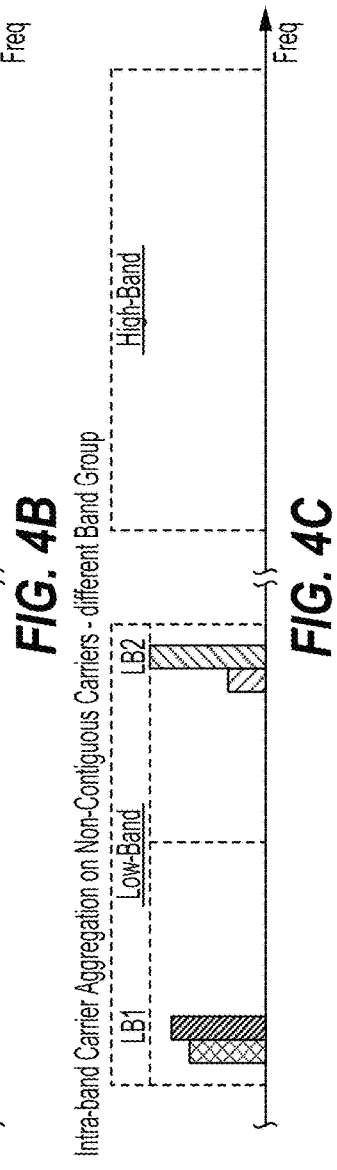

FIG. 4C shows an example of inter-band CA in the same band group. In the example shown in FIG. 4C, a wireless device (e.g., the wireless device 110) is configured with four carriers in two bands in the same band group, which is low-band. The wireless device may send and/or receive transmissions on multiple carriers in different bands in the same band group (e.g., low-Band 1 (LB1) and low-Band 2 (LB2) in FIG. 4C).

Figure 4D:
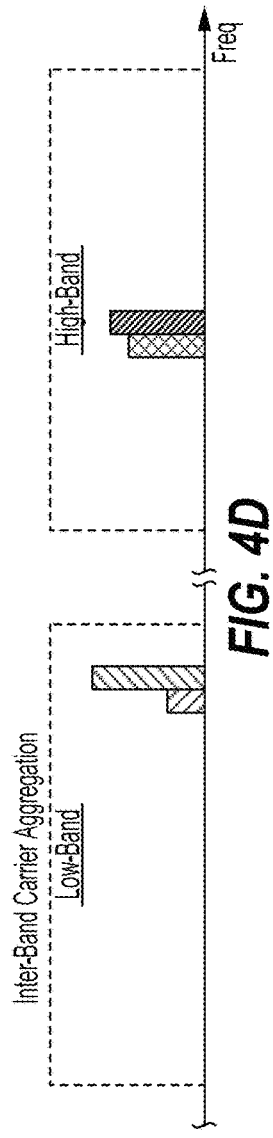

FIG. 4D shows an example of inter-band CA in different band groups. In the example shown in FIG. 4D, a wireless device (e.g., the wireless device 110) is configured with four carriers in two bands in different band groups, which include two carriers in one band in low-band and two additional carriers in another band in high-band. The wireless device may send and/or receive transmissions on multiple carriers in different bands in different band groups (e.g., low-band and high-band in FIG. 4D). FIGS. 4A to 4D show four examples of carrier aggregation. Carrier aggregation may also be supported for other combinations of bands and band groups. For example, carrier aggregation may be supported for low-band and high-band, mid-band and high-band, high-band and high-band, and other band combinations with ultra-high band and long term evolution in unlicensed spectrum (LTE-U).

FIG. 5 illustrates an example of a communication system 500 in which aspects of the disclosure may be implemented. The communication system 500 includes a UE 502, a first base station (e.g., an LTE base station (LTE BS) 504), and a second base station (e.g., mmW base station (mmW BS) 506). The UE 502 is within the coverage area 508 of the LTE base station 504 and may therefore communicate with (e.g., connect to) the LTE base station 504. The LTE network communication between the UE 502 and the LTE base station 504 is via an LTE uplink (UL) and an LTE downlink (DL), collectively represented in FIG. 5 by the dashed lines 512. The UE 502 is also within the coverage area 510 of the mmW base station 506 and may therefore communicate with (e.g., connect to) the mmW base station 506. The mmW network communication between the UE 502 and the mmW base station 506 is via an mmW uplink (UL) and a mmW downlink (DL), collectively represented in FIG. 5 by the dashed lines 514. The LTE base station 504 and the mmW base station 506 communicate via an X2 interface 516.

In some aspects, the LTE links may be more reliable than the mmW links. However, the LTE links may have lower throughput. Thus, the LTE links are preferred over the mmW links in some scenarios, while the mmW links are preferred over the LTE links in other scenarios. The mmW links are beamformed. These links may be monitored and adjusted frequently. The mmW links are high throughput, and are thus preferred in some scenarios. The X2 interface 516 is a high speed link that is used for communication between the LTE base station 504 and the mmW base station 506. The X2 interface 316 has relatively high throughput and low latency. While the base stations are described with respect to LTE and mmW, the first and the second base stations may also be base stations of other radio access technologies such as LTE, CDMA2000, WCDMA, TD-SCDMA, GSM, etc. The first base station and the second base stations can be operated by different operators (e.g., operator 1 and operator 2, respectively). Accordingly, signals to a user equipment from a first bases station may be subject to unwanted jammer signals from the second operator as illustrated in FIG. 6B.

The different operators may have different spectrums. For example, multiple operators may occupy the 28 GHz spectrum with different bandwidths. Radio frequency (RF) signals from the first operator may be deemed wanted or desirable signals while jammers interfering with the RF signal from the first operator are unwanted signals that may be from the second operator. These jammers may saturate an input of an analog-to-digital converter of a receiver and clip the wanted signals.

FIG. 6A is a block diagram that depicts a single receiver 600A of a wireless device that is operable to adjust a frequency of a signal communicated between a radio frequency (RF) device 602 and an intermediate frequency (IF) device 604 according to a filtering mode (e.g., a notch filter mode). The RF device 602 and the IF device 604 may be coupled together via an interface device. In one aspect of the disclosure, the interface device may be an IF cable 622 (e.g., a coaxial cable). The single receiver 600A may be implemented in the wireless device 110 of FIG. 1 or the wireless device 200 of FIG. 2.

A receive signal path of the single receiver 600A includes a receive signal path of the RF device 602 having multiple antennas (e.g., antennas 648A, 648B, . . . 648N), and multiple LNAs (e.g., LNAs 652A, 652B, . . . 652N), which amplify RF signals received by the RF device 602. The received RF signals may be carrier aggregation signals. These received RF signals may respectively have center frequencies f RXA, f RXB, . . . f RXN. Outputs of the LNAs 652A, 652B, . . . 652N are coupled to mixers 661A, 661B . . . 661N, which mix the outputs of the LNAs 652A, 652B, . . . 652N with a local oscillator (LO) signal 639 from a local oscillator, such as a voltage controlled oscillator (VCO) 680 of a phase locked loop, to downconvert the outputs of the mixers 661A, 661B . . . 661N. The same local oscillator may also be used for upconversion during transmission. Devices 601A-601N are phase shifters that add delay to each receive signal path making a combined signal to achieve beam formation in accordance with a phased array antenna system.

A first multiplexer 607 of the RF device 602 has a first filter 641A to pass an IF signal 633 to the IF device 604. The first multiplexer also includes a second filter 641B to pass a local oscillator reference signal (e.g., from a radio frequency local oscillator (RFLO) 626) to the VCO 680 of the RF device 602. The IF device 604 and/or the RF device 602 may also include frequency dividers 628 (e.g., divide by M) and 653 (divide by N, where M and N are integers) and a multiplier 605 to provide frequency division and frequency multiplication for timing circuitry (e.g., phase locked loop) of the single receiver 600A. The multiplier 605 and the dividers 628 and 653 may be variable multipliers and dividers. The RFLO may be a reference oscillator for a phase locked loop including the VCO 680 such that a reference signal from the RFLO 626 is passed on to the VCO 680 via a first frequency divider 628 (e.g., an integer divider) and a first multiplier 605 (e.g., an integer multiplier).

In one aspect of the disclosure, a down-converter may use a front end scheme to select a destination signal and another scheme (e.g., a heterodyne scheme) to convert the received radio frequency signals to the IF signal 633, instead of directly converting the received radio frequency (RF) signal to a baseband (BB) signal. In one aspect of the disclosure, the IF signal may be a summed sliding-IF output signal (e.g., from a summer 603) that is amplified by a second LNA 662.

For example, following down-conversion of the received RF signals, the summer 603 is provided to sum the sliding-IF outputs of the mixers 661A, 661B . . . 661N. The summed sliding-IF output signal is then amplified by the second LNA 662 and provided to the IF device 604. The summed sliding-IF output signal may be passed on to the IF device 604 via the first multiplexer 607 (e.g., diplexer) and the IF cable 622 coupled to the first multiplexer 607.

The receive signal path of the single receiver 600A continues in the IF device 604 and includes a main path 635 and an auxiliary path 637. The IF device 604 receives the summed sliding-IF output signal via a second multiplexer 624 (e.g., a diplexer). The second multiplexer 624 includes a third filter 643A through which the local oscillator reference signal is passed to the VCO 680 and a fourth filter 643B to pass the received summed sliding-IF output signal. One or more of the filters 641A, 641B, 643A and 643B may be a variable filter having an adjustable passband to accommodate frequency shifting of one or more signals transmitted over the cable 622.

The main path 635 includes a third LNA 619 and a fourth LNA 621 to amplify the received RF signal. The main path 635 also includes a first complex signal path 635A and a second complex signal path 635B of the IF device 604. The wanted signals of the received RF signal travel through the main path 635 to a modem 610 that includes a first ADC 616A and a second ADC 616B. The first ADC 616A and the second ADC 616B support complex signals through the first complex signal path 635A and the second complex signal path 635B. In the main path 635, the received RF signal is converted to complex signals that traverse the first complex signal path 635A and the second complex signal path 635B. The complex signals have a phase difference of ninety degrees. The complex signals are down-converted to baseband using mixers 623 and 625, filtered using filters 629 and 631 and then passed on to the modem 610 for further processing. For example, the mixers 623 and 625 downconvert the wanted signals to complex signals that traverse the first complex signal path 635A and the second complex signal path 635B.

The auxiliary path 637 is in a shunt or parallel configuration relative to the main path of the IF device 604, as shown in the region 651. In this illustration, the auxiliary path 637 starts at a node 650 between the third LNA 619 and the fourth LNA 621 and ends at a ground 609. The auxiliary path 637 includes a third complex signal path 637A and a fourth complex signal path 637B. An N-path filter of the auxiliary path 637 is included in the third complex signal path 637A and the fourth complex signal path 637B. The auxiliary path 637 also includes mixers 615 and 617 coupled to the N-path filter. The N-path filter may include impedance (Z) that may be any combination of passive devices (e.g., capacitors 611 and 613) or any structure that provides a desired frequency response of the N-path filter (in this case, a notch filter).

For example, while in this case the impedance (Z) is represented by capacitors 611 and 613, the impedance may be the combination of passive components and structures that provide a frequency response of the notch filter, a complex notch filter, a bandpass filter, a complex bandpass filter, or a bandstop filter. The complex filters may include a main or in-phase (I) and quadrature (Q) phase that are ninety degrees out of phase with the main phase. The N-path filter may be a notch filter or a complex bandpass filter to filter out unwanted signals (e.g., jammers) from the main path 635. The notch filter may be coupled to a relatively high impedance node of an LNA block, such as between an output of the LNA 619 and an input of the LNA 621.

The IF device 604 includes multiple (e.g., two) local oscillators to be used based on the operating mode of the single receiver 600A. For example, the two oscillators include the RFLO 626 and an intermediate frequency local oscillator (IFLO) 627. The IFLO 627 is selectively coupled to the auxiliary path 637 via a switch 649. The switch 649 selectively routes a reference oscillation signal from the IFLO 627 to the auxiliary path 637 that includes the N-path filter and corresponding mixers 615 and 617. The notch filter attenuates components of the received RF signal at a notch frequency. For example, an amplified received RF signal generated by the LNA 619 is filtered by the notch filter.

In the filtering mode (e.g., notch filter mode) as illustrated in FIG. 6A, one of the local oscillators (e.g., IFLO 627) is driving the N-path filter and the other local oscillator (e.g., RFLO 626) is used for another mode (e.g., the sliding intermediate frequency mode). To achieve the filtering mode, the switch 649 connects the IFLO 627 to the auxiliary path 637 during carrier aggregation communication.

FIG. 6B is an exemplary graph 600B illustrating impedance characteristics of an N-path filter in an auxiliary path of the single receiver of FIG. 6A. In this case, the filter is a notch filter and the graph 600B represents a response of the notch filter. The horizontal axis of the graph 600B represents frequency while the vertical axis represents amplitude of the received RF signal. The received RF signal may be based on mmW communications with a bandwidth spanning from a lower frequency FL to an upper frequency FH. The reference frequency (RFLO) is at a center frequency FC of the bandwidth. For example, the received RF signal includes multiple component carriers CC1-CC8 where the component carriers CC1, CC3, CC4, CC5, CC6, CC7, and CC8 represent wanted signals of the received RF signal. The notch filter filters out one or more portions of the jammer signal in one or more gaps between intra-band non-contiguous frequency bands (CC1, CC3, CC4, CC5, CC6, CC7, and CC8). For example, unwanted or jammer signals occur between component carrier 1 (CC1) and component carrier 3 (CC3). The unwanted jammer signals may occur in one or more gaps 645 between the non-contiguous frequency bands of the received RF signal. In a complex receiver when there is an IQ imbalance (e.g., in gain phase) the imbalance creates an image. By eliminating the large signal in a real-signal domain using the N-path filter, image rejection is improved.

The notch filter may be coupled to a relatively high impedance node of the LNA block, such as between an output of the LNA 619 and an input of the LNA 621. The response for the notch filter is a complete pass band over a usable range of frequencies F1, F3, F4, F5, F6, F7, with the exception of a notch frequency FN. For example, the notch filter provides an approximately constant impedance across a frequency range, F1, F3, F4, F5, F6, F7, and may provide a lower-impedance "notch" at the notch frequency FN. At the notch frequency FN, the response falls very fast providing a high level of attenuation that is able to remove the unwanted signal. For example, the notch frequency FN may correspond to a frequency of the IFLO 627 in the receiver 600A.

The reduced impedance at the notch frequency FN attenuates components of the received RF signal corresponding to the notch frequency FN. For example, components (e.g., CC2) of the received RF carrier aggregation signal having the notch frequency FN may be attenuated by following the lower-impedance path to ground while other components (e.g., CC1, CC3, CC4, CC5, CC6, CC7, and CC8) of the received RF carrier aggregation signal do not encounter the lower-impedance path (because the notch filter is frequency-specific).

Figure 7A:
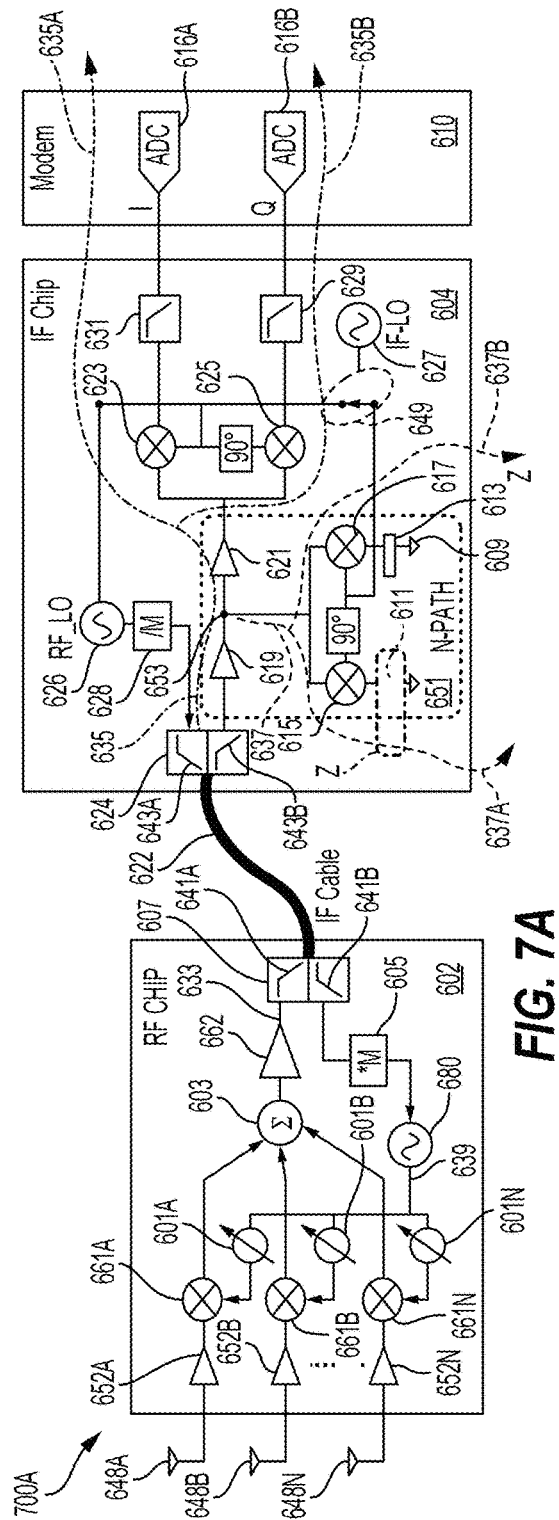
FIG. 7A is a block diagram that depicts a single receiver of a wireless device that is operable to adjust a frequency of a signal communicated between the radio frequency (RF) device and the intermediate frequency (IF) device according to a low power sliding-IF mode.

FIG. 7A is a block diagram that depicts a single receiver 700A of a wireless device that is operable to adjust a frequency of a signal communicated between the RF device 602 and the intermediate frequency (IF) device 604 according to a low power sliding-IF mode. For illustrative purposes, some of the labelling and numbering of the devices and features of FIG. 7A are similar to those of FIG. 6A. However, instead of a notch filter illustrated by FIG. 6A, FIG. 7A illustrates a complex bandpass filter with double bandpass (e.g., a first bandpass and a second bandpass). Moreover, the single receiver of FIG. 7A operates in accordance with the low power sliding-IF mode where a single local reference oscillator (e.g., RFLO 626) is used instead of two local oscillators (e.g., RFLO 626 and IFLO 627), as in the notch filter mode illustrated in FIG. 6A. For example, the IFLO 627 is decoupled from the N-path filter by the switch 649.

Figure 7B:
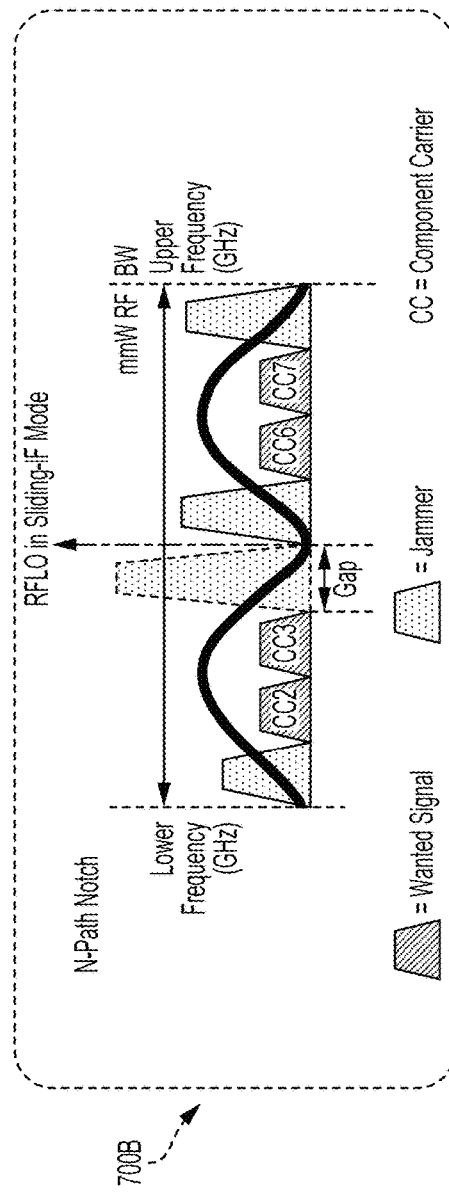
FIG. 7B is an exemplary graph illustrating impedance characteristics of a bandpass filter in an auxiliary path of the single receiver of FIG. 7A.

FIG. 7B is an exemplary graph 700B illustrating impedance characteristics of the bandpass filter in an auxiliary path 637 of the single receiver 700A of FIG. 7A. For illustrative purposes, some of the labelling and numbering of the graph 700B and features of FIG. 7B are similar to those of FIG. 6B. However, instead of illustrating a frequency response of the notch filter of FIG. 6B, FIG. 7B illustrates a frequency response of a bandpass filter (e.g., a complex bandpass filter). In this case, the switch 649 in FIG. 7A is connected to the RFLO 626 instead of being connected to the IFLO 627, as in FIG. 6A. Moreover, the impedance (Z) may include a combination of passive components and structures that provide a frequency response (illustrated in FIG. 7B) of the complex bandpass filter.

In this aspect, the N-path filter is implemented to provide complex bandpass filters, such that at a radio frequency or intermediate frequency. Two bandpass responses are available to extract two separate clusters of wanted signals. For example, the first cluster includes component carriers CC2 and CC3 while the second cluster includes component carriers CC6 and CC7. The component carriers CC2, CC3, CC6 and CC7 are wanted signals.

FIG. 8A is a block diagram that depicts a single receiver 800 of a wireless device that is operable to adjust a frequency of a signal communicated between the radio frequency (RF) device 602 and the intermediate frequency (IF) device 604 according to a filtering mode where the filter is included in an auxiliary path of the RF device. For illustrative purposes, some of the labelling and numbering of the devices and features of FIG. 8A are similar to those of FIGS. 6A and 7A.

In one aspect of the disclosure, the N-path filter may be a complex bandpass filter with single bandpass, as illustrated in the graph 700B of FIG. 7B. For example, the complex band pass filter gives only one sided filter in RF. In this aspect, however, the bandpass filter is implemented in a region 851 of the RF device 602 that is between the summer 603 and the first multiplexer 607. For illustrative purpose, the region 851 of FIG. 8A is extrapolated to FIG. 8B. The complex bandpass filter may be coupled to a relatively high impedance node (e.g., node 847) of the LNA block of the RF device 602, such as at an output (e.g., node 847) of the second LNA 662. The auxiliary path 637 and the main path 635 of the RF device are supported by a same reference oscillator (e.g., RFLO 626). For example, the reference frequency signal from the RFLO 626 is provided to the complex band pass filter in the region 851 via the node 849 and the frequency divider 853. Alternatively, a notch filter may be included in the RF device 602 and the reference signal may be provided to the notch filter by a dedicated oscillator, as in FIG. 6A.

Figure 9:
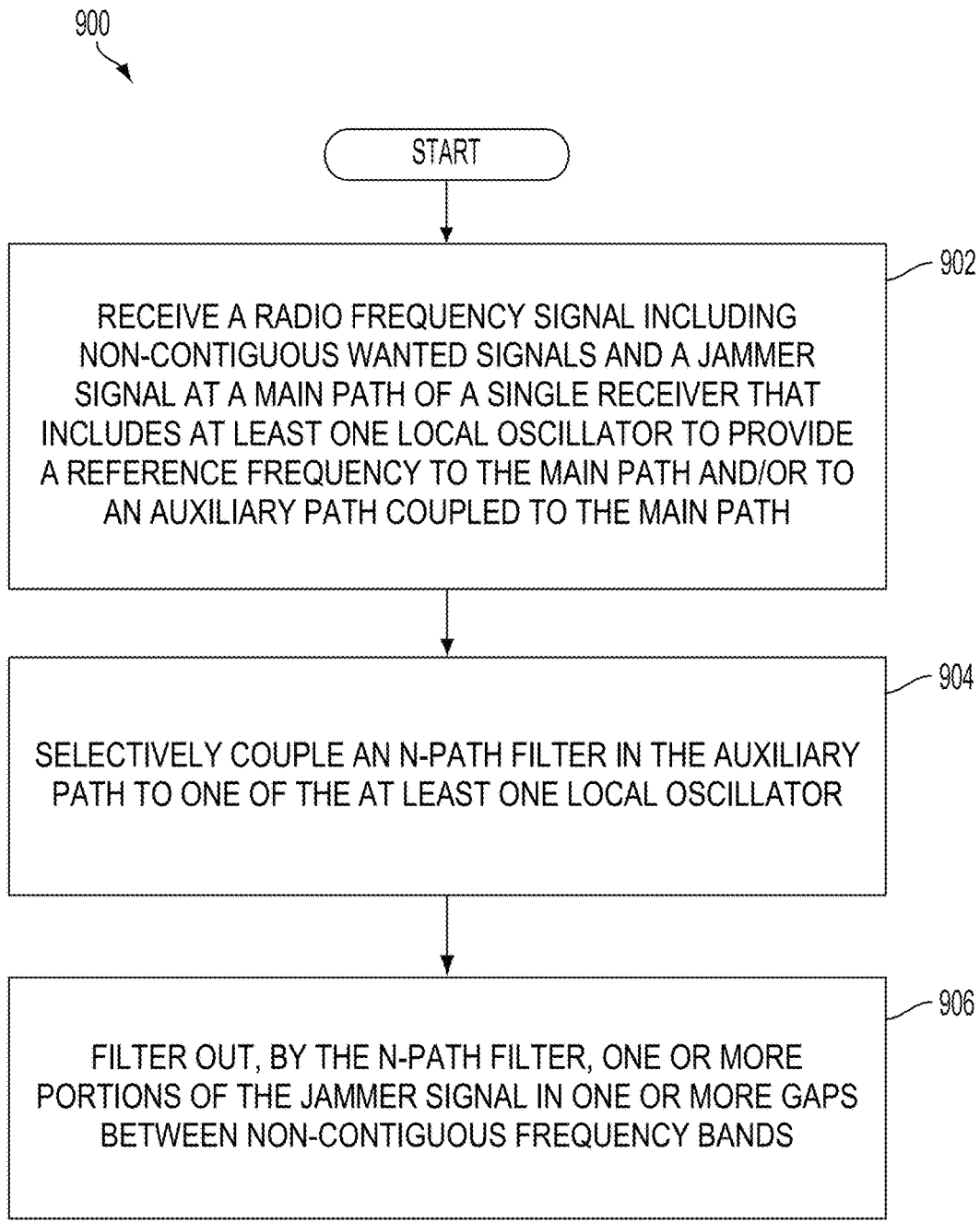
FIG. 9 depicts a simplified flowchart of a method for filtering jammer signals in a single receiver, according to aspects of the present disclosure.

FIG. 9 depicts a simplified flowchart of a method 900 for filtering jammer signals in a single receiver. At block 902, a radio frequency signal including non-contiguous wanted signals and a jammer signal is received at a main path of the single receiver that includes at least one local oscillator to provide a reference frequency to the main path and/or to an auxiliary path coupled to the main path. At block 904, an N-path filter in the auxiliary path is selectively coupled to one of the local oscillator(s). At block 906, the N-path filter filters out one or more portions of the jammer signal in one or more gaps between non-contiguous frequency bands.

According to one aspect of the present disclosure, a single receiver to process multiple signals is described. The single receiver includes means for providing a first reference signal to the main path and/or to the N-path filter of the auxiliary path. The reference signal providing means may, for example, be IFLO 627, and/or RFLO 626. In another aspect, the aforementioned means may be any module or any apparatus or material configured to perform the functions recited by the aforementioned means.

FIG. 10 is a block diagram showing an exemplary wireless communication system in which a configuration of the disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025B, and 1025C that include the disclosed receiver. It will be recognized that other devices may also include the disclosed receiver, such as the base stations, switching devices, and network equipment. FIG. 10 shows forward link signals 1080 from the base station 1040 to the remote units 1020, 1030, and 1050 and reverse link signals 1090 from the remote units 1020, 1030, and 1050 to base station 1040.

In FIG. 10, remote unit 1020 is shown as a mobile telephone, remote unit 1030 is shown as a portable computer, and remote unit 1050 is shown as a fixed location remote unit in a wireless local loop system. For example, a remote unit may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof Although FIG. 10 illustrates remote units according to the aspects of the disclosure, the disclosure is not limited to these exemplary illustrated units. Aspects of the disclosure may be suitably employed in many devices, which include the receiver.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A single receiver to process multiple signals comprising:
   a main path comprising an input that receives an input signal comprising non-contiguous wanted signals and a jammer signal, and an output coupled to a modem, the output providing the non-contiguous wanted signals to the modem;
   an auxiliary path to ground comprising an N-path filter, which includes a plurality of mixers, the N-path filter configured to filter out at least a portion of the jammer signal in at least one gap between the non-contiguous wanted signals in a same frequency band; and
   a first local oscillator coupled to the main path and coupled to a switch that is coupled to the auxiliary path, the first local oscillator configured to provide a first reference signal to the main path and configured to provide the first reference signal to the switch, the switch being coupled to the N-path filter of the auxiliary path; and
   a second local oscillator configured to oscillate at a different frequency than the first local oscillator, the second local oscillator coupled to the switch wherein the switch comprises a first throw coupled to the first local oscillator and a second throw coupled to the second local oscillator and a pole coupled to the N-path filter of the auxiliary path.

2. The single receiver of claim 1, in which the non-contiguous wanted signals comprise millimeter wave (mmW) signals down-converted to an intermediate frequency (IF) via a sliding intermediate frequency local oscillator scheme.

3. The single receiver of claim 1, in which the first local oscillator is configured to provide a first reference signal to the main path and a second reference signal to the plurality of mixers, in which the first local oscillator is from a sliding intermediate frequency (IF) architecture.

4. The single receiver of claim 1, in which the auxiliary path and the main path are operating in accordance with an intermediate frequency.

5. The single receiver of claim 1, in which the main path, the auxiliary path and the first local oscillator are included in an intermediate frequency device (IF device) and in which the single receiver further comprises a radio frequency circuit between an antenna and the intermediate frequency device.

6. The single receiver of claim 1, in which the switch couples the second local oscillator to the N-path filter and the N-path filter comprises a complex bandpass filter.

7. The single receiver of claim 1, in which the switch couples the first local oscillator to the N-path filter and the N-path filter comprises a complex notch filter.

8. The single receiver of claim 1, in which the non-contiguous wanted signals in the same frequency band correspond to non-contiguous component carriers in a carrier aggregation system.

9. The single receiver of claim 1, in which a front-end of the single receiver includes a plurality of receive paths and a multiplexer where the N-path filter is placed in a shunt configuration between separate up/down converter circuit blocks.

10. The single receiver of claim 1, in which the first local oscillator comprises at least one sliding intermediate frequency local oscillator coupled to the plurality of mixers, the at least one sliding intermediate frequency local oscillator configured to achieve a low power sliding intermediate frequency mode.

11. A method for filtering jammer signals in a single receiver, comprising:
    receiving a radio frequency signal including non-contiguous wanted signals and a jammer signal at a main path of the single receiver that includes at least one local oscillator to provide a reference frequency to the main path and/or to an auxiliary path coupled to the main path;
    selectively coupling the first local oscillator to a mixer via a switch comprising a first throw coupled to the first local oscillator and a second throw coupled to a second local oscillator, the mixer being coupled to an impedance of an N-path filter in the auxiliary path; and
    filtering out, by the N-path filter, at least a portion of the jammer signal in at least one gap between the non-contiguous wanted signals in a same frequency band.

12. The method for filtering jammer signals in a single receiver of claim 11, further comprising providing a first reference signal to the main path and a second reference signal to the mixer.

13. The method for filtering jammer signals in a single receiver of claim 11, further comprising selectively coupling the at least one local oscillator to the mixer.

14. A single receiver to process multiple signals comprising:
    a main path comprising an input that receives an input signal comprising non-contiguous wanted signals and a jammer signal, and an output coupled to a modem, the output providing the non-contiguous wanted signals to the modem;
    an auxiliary path to ground comprising an N-path filter, which includes a plurality of mixers, the N-path filter configured to filter out at least a portion of the jammer signal in at least one gap between the non-contiguous wanted signals in a same frequency band; and
    means for providing a first reference signal provided by a first local oscillator to the main path; and
    means for selectively providing either the first references signal or a second reference signal provided by a second local oscillator to the N-path filter of the auxiliary path.

15. The single receiver of claim 14, in which the non-contiguous wanted signals comprise millimeter wave (mmW) signals down-converted to an intermediate frequency (IF) via a sliding intermediate frequency local oscillator scheme.

16. The single receiver of claim 14, in which the main path, the auxiliary path and the reference signal providing means are included in an intermediate frequency device (IF device) and in which the single receiver further comprises a radio frequency circuit between an antenna and the intermediate frequency device.

17. The single receiver of claim 14, in which the N-path filter comprises a complex bandpass filter.

18. The single receiver of claim 14, in which the N-path filter comprises a complex notch filter.

19. The single receiver of claim 14, in which the non-contiguous wanted signals in the same frequency band correspond to non-contiguous component carriers in a carrier aggregation system.

20. The single receiver of claim 14, in which a front-end of the single receiver includes a plurality of receive paths and a multiplexer where the N-path filter is placed in a shunt configuration between separate up/down converter circuit blocks.

21. The single receiver of claim 14, in which the reference signal providing means is selectively coupled to the plurality of mixers.

* * * * *